(12) United States Patent
Saurabh et al.

(10) Patent No.: US 7,834,709 B2
(45) Date of Patent: Nov. 16, 2010

(54) CIRCUIT FOR VOLTAGE CONTROLLED OSCILLATOR

(75) Inventors: Kanan Saurabh, Ghaziabad (IN); Rawinder Dharmalinggam, Singapore (SG)

(73) Assignee: PLX Technology, Inc., Sunnyvale, CA (US)

( * ) Notice: Subject to any disclaimer, the term of this patent is extended or adjusted under 35 U.S.C. 154(b) by 97 days.

(21) Appl. No.: 12/245,078

(22) Filed: Oct. 3, 2008

(65) Prior Publication Data

US 2010/0085127 A1   Apr. 8, 2010

(51) Int. Cl.
*H03K 3/03* (2006.01)
*H03L 7/099* (2006.01)

(52) U.S. Cl. .................... 331/57; 331/185; 327/287

(58) Field of Classification Search .................... 331/57, 331/185; 327/262, 266, 287
See application file for complete search history.

(56) References Cited

U.S. PATENT DOCUMENTS

| | | | | |
|---|---|---|---|---|
| 5,793,239 | A * | 8/1998 | Kovacs et al. | 327/262 |
| 6,094,103 | A * | 7/2000 | Jeong et al. | 331/57 |
| 6,275,117 | B1 * | 8/2001 | Abugharbieh et al. | 331/57 |
| 7,061,337 | B2 * | 6/2006 | Partovi et al. | 331/109 |
| 2003/0076179 | A1 * | 4/2003 | Branch et al. | 331/57 |

* cited by examiner

*Primary Examiner*—Robert Pascal
*Assistant Examiner*—Levi Gannon
(74) *Attorney, Agent, or Firm*—Beyer Law Group LLP

(57) ABSTRACT

A voltage controlled oscillator and a load cell circuit usable in VCO are provided. The VCO features an internal compensation for process, voltage and temperature using a replica of half of the oscillating stage. The load cell circuit comprises a bias transistor to drain a predetermined current from the oscillating stage, a control transistor to vary resistance offered by it responsive to a control voltage applied and a resistor adapted to provide a clamp resistance.

20 Claims, 5 Drawing Sheets

US 7,834,709 B2

CIRCUIT FOR VOLTAGE CONTROLLED OSCILLATOR

SUMMARY

This invention is generally related to integrated circuits. More particularly, the present invention provides techniques for voltage controlled oscillator circuit needed in the integrated circuits.

BACKGROUND OF RELATED ART

Integrated circuit components are used in various kinds of electronic devices used in day-to-day life such as computers, electronic appliances, television, mobile phones, cars, and so on. These components include without limitation microprocessors, microcontrollers, digital logic circuits, A/D and D/A converters, memory devices, display devices etc. The processing within the integrated circuit components as well as interaction between the various integrated circuit components in a circuit needs to occur in synchronization with predetermined time reference. This time reference is often called as "clock". Typically, the clock is a sequence of electric pulses which occur at regular interval (e.g., every 1 microsecond for 1 MHz clock, every 1 nanosecond for 1 GHz clock etc.). These pulses are generated by clock generator and supplied to integrated circuit components in the circuit to provide them with common time reference.

The clock generator often includes a circuit component called Phase Locked Loop (PLL). The PLL generates an output signal of a frequency which is locked to (multiple of) the input signal frequency. The input signal typically comes from a stable frequency reference such as "quartz crystal". The PLL detects any difference (error) between the output frequency and the input frequency, and changes the output frequency to eliminate the error. This is typically achieved by generating a control signal which is related to the error and feeding this control signal to Voltage Controlled Oscillator (VCO). VCO is a component whose output frequency is controllable (changeable) by applying proper control signal (control voltage).

Though VCO has been described in clock application, it also has several other applications such as reference frequency generator in radio circuits etc. In general, the VCO needs to have certain desirable properties such as described below, in addition to others:

Low jitter: The clock output by the VCO must have substantially equispaced zero-crossings. There should be minimum variation in the time duration between two successive zero-crossings over time.

Low conversion gain constant (KVCO): For low jitter applications, the conversion gain constant (KVCO) which is the ratio of the change in the VCO frequency to the change in input voltage should be small. This ensures that noise created by stages preceding the VCO does not unduly affect the overall clock jitter.

Sufficient tuning range: The tuning range of the VCO (the minimum to maximum frequency it can reach in all conditions) should be large enough to accommodate the ranges desired for applications.

Minimal variation of the conversion gain constant (KVCO) with variation in process corner, supply voltage, and temperature: This is necessary to maintain the stability of the PLL as the KVCO is a critical parameter contributing to the overall loop bandwidth.

Clearly, techniques for implementing VCO which can exhibit one or more of the properties described above and other properties are highly desirable.

BRIEF SUMMARY OF THE INVENTION

This invention is generally related to integrated circuits. More particularly, the present invention provides techniques for voltage controlled oscillator module needed in the integrated circuits.

An object of the present invention is to provide a novel VCO circuit with an improved biasing scheme. In an embodiment, the present invention aims at improving the jitter performance. In another embodiment, the present invention aims at improving the stability of the PLL loop.

According to an embodiment of the present invention a resistor is added in shunt in the load cell of the VCO. This can improve the linearity of operation. According to another embodiment of the present invention, the steady signals in the VCO are biased through a low frequency (e.g., very low frequency) low pass filter. The low pass filter can filter out noise from transistors which do not operate at high frequency and this can advantageously reduce the overall jitter. According to yet another embodiment of the present invention, control voltage is directly fed to the VCO (e.g., unlike through a conditioning stage as is conventional). This can advantageously reduce power dissipation and noise. These improvements alone or in combination can advantageously provide improved jitter performance.

According to yet another embodiment, by biasing the VCO through the novel biasing stage and the changed load cell, and by ensuring that the transistor controlling the VCO frequency is always biased in the linear region of operation, the variation in the KVCO over process corners, voltage, and temperature is reduced. This can improve the stability of the PLL. In another embodiment, addition of the resistor in shunt provides that the VCO oscillates with almost all values of the control voltage. This prevents the VCO from stopping oscillations in a certain corner with too high or too low a control voltage. These improvements alone or in combination can provide for increased stability for the VCO.

It is also an object of the present invention to generate a bias voltage VBIAS, which when suitably applied to the VCO, gives optimum control over VCO gain. It is yet another object of the present invention to feed the control voltage of the VCO, VCONTROL, which controls the frequency of oscillation, directly to the VCO without sending it through another stage.

By centering the VCO about the desired frequency of oscillation, we can reduce the tuning range of the VCO and consequently, the changes in KVCO. This is possible because the VBIAS voltage automatically compensates for process and temperature variations so that the VCO remains centered around the desired frequency in all cases. In a specific embodiment, a load cell circuit usable in Voltage Controlled Oscillator (VCO) is provided. The circuit comprises a bias transistor, a control transistor and a resistor in parallel. The bias transistor is adapted to drain substantially fixed current from the oscillating stage. The control transistor is adapted to vary resistance offered by it responsive to a control voltage applied at its gate terminal. The resistor is adapted to provide a clamp resistance.

In a specific embodiment, the VCO bias signal, VBIAS is derived from a replica load cell coupled to an amplifier connected in negative feedback which ensures that the load cell always offers fixed resistive impedance over variations in process corner, temperature and supply voltage. This VBIAS when sent to all the oscillating stages in the VCO, and suitably applied, ensures that the VCO always oscillates close to a desired fixed frequency by default in the face of variations due to process corner, supply voltage and temperature.

Depending upon the embodiment, various advantages and/or benefits as described above and throughout the present specification can be achieved by practicing the present invention. These and various other objects, features and advantages of the present invention can be more fully appreciated with reference to the detailed description and accompanying drawings that follow.

BRIEF DESCRIPTION OF THE DRAWINGS

Embodiments of the invention are illustrated in the figures of the accompanying drawings. These figures are merely examples which should not unduly limit the scope of the invention. Persons of ordinary skill in the art can contemplate many alternatives, variations and modifications within the scope of the invention described herein.

DETAILED DESCRIPTION OF THE ILLUSTRATED EMBODIMENTS

This invention is generally related to integrated circuits. More particularly, the present invention provides techniques for voltage controlled oscillator module needed in the integrated circuits.

Integrated circuit components are used in various kinds of electronic devices used in day-to-day life such as computers, electronic appliances, television, mobile phones, cars, and so on. These components include without limitation microprocessors, microcontrollers, digital logic circuits, A/D and D/A converters, memory devices, display devices etc. The processing within the integrated circuit components as well as interaction between the various integrated circuit components in a circuit needs to occur in synchronization with predetermined time reference. This time reference is often called as "clock". Typically, the clock is a sequence of electric pulses which occur at regular interval (e.g., every 1 microsecond for 1 MHz clock, every 1 nanosecond for 1 GHz clock etc.). These pulses are generated by clock generator and supplied to integrated circuit components in the circuit to provide them with common time reference.

The clock generator often includes a circuit component called Phase Locked Loop (PLL). The PLL produces an output signal of a frequency which is locked to (multiple of) the input signal frequency. The input signal typically comes from a stable frequency reference such as "quartz crystal". The PLL detects any difference (error) between the output frequency and the input frequency, and changes the output frequency to eliminate the error. This is typically achieved by generating a control signal which is related to the error and feeding this control signal to Voltage Controlled Oscillator (VCO). VCO is a component whose output frequency is controllable (changeable) by applying proper control signal (control voltage).

Though VCO has been described in clock application, it also has several other applications such as reference frequency generator in radio circuits etc.

The VCO needs to have certain desirable properties such as low jitter, low conversion gain constant (KVCO), sufficient tuning range, and minimal variation of the conversion gain constant (KVCO) with variation in process corner, supply voltage, and temperature.

Figure 1:
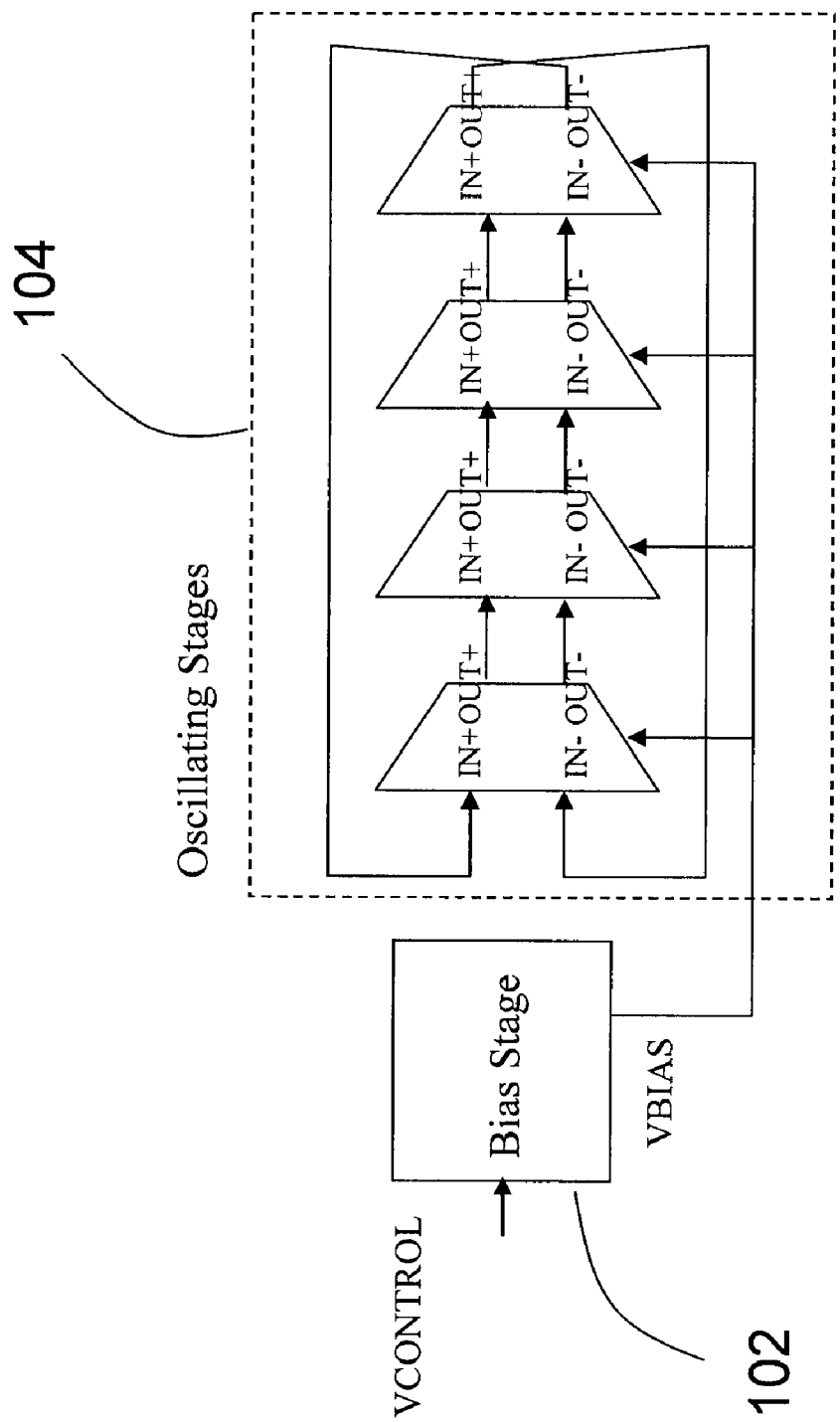
FIG. 1 shows an exemplary schematic of a VCO.

An exemplary schematic of a VCO is illustrated in FIG. 1. As shown, the VCO can include a bias stage 102 and one or more oscillating stages 104. As shown, the bias stage 102 (sometimes also referred as "signal conditioning circuit" takes as input VCONTROL and generates bias voltage (VBIAS) which is fed to the one or more oscillating stage. Changing the VCONTROL changes the VBIAS which leads to changes in the gain stage behavior (increase/decrease stage gain or bandwidth) of the oscillating stage. This leads to a change in the frequency of oscillation.

Figure 2:
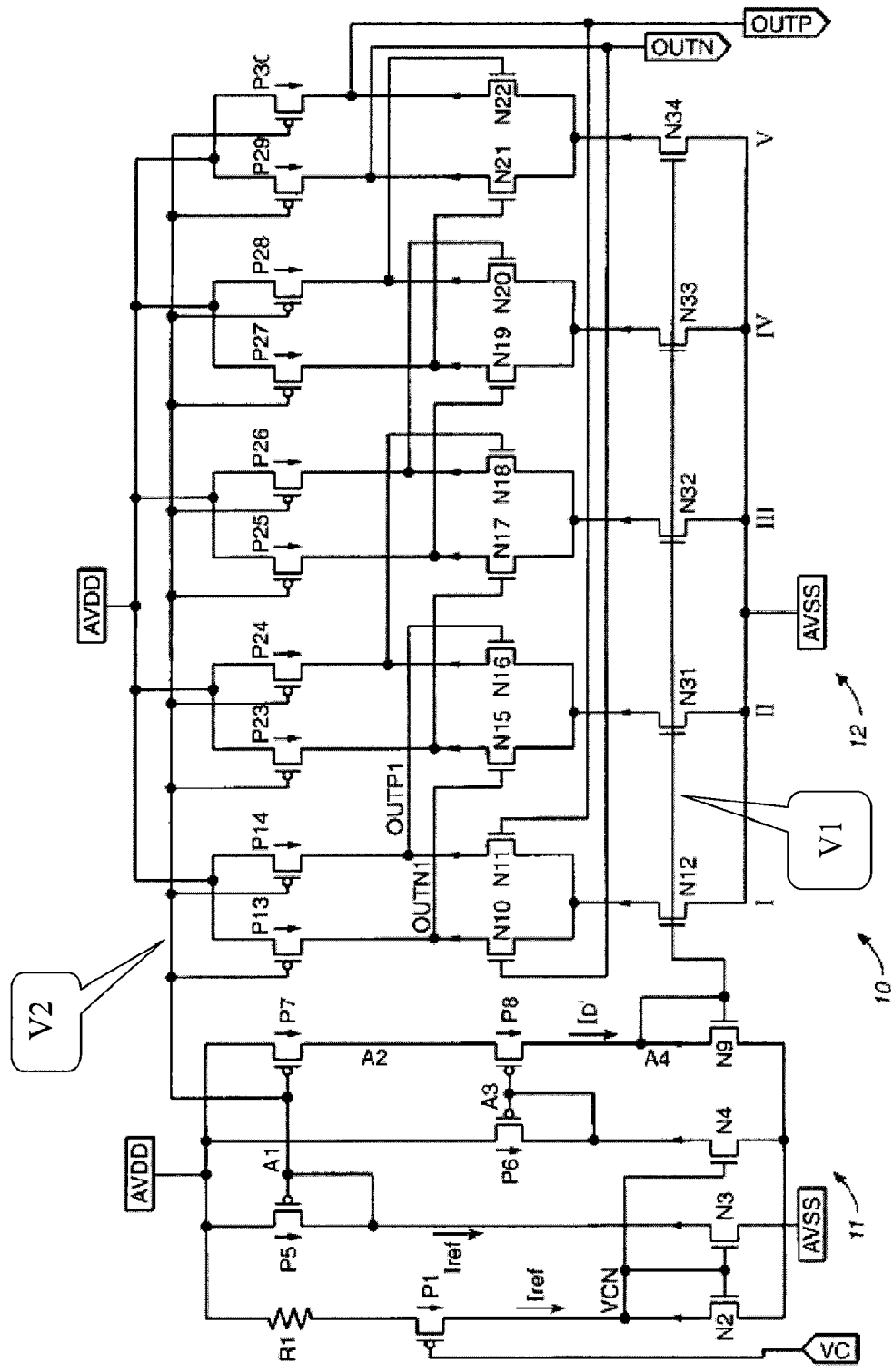
FIG. 2 shows a more detailed exemplary schematic of VCO according to certain conventional technique.

FIG. 2 illustrates a more detailed schematic of a VCO according to certain conventional technique, e.g., as disclosed in U.S. Pat. No. 6,011,443 to Chen et al. Specifically, FIG. 2 shows PMOS implementation as an example, though NMOS or combination of PMOS and NMOS can also be used. Shown in the figure is bias stage 11 and a plurality of oscillating stages 12. The bias stage takes as input VCONTROL and generates: A voltage (V1) to bias the transistors N12, N31-N34, and a second voltage (V2) to bias the transistors P13-P14, P23-P24 etc. The bias stage thus ensures that the transistors P13-P14, P23-P24 are biased in the linear region. This reduces the resistance offered by them and allows high frequency oscillation. The bias stage also ensures that N12, N31-34 are biased in such a way that they source sufficient current to maintain a fixed output swing. The bias stage also ensures that the circuit functions as desired over a wide range of VCONTROL. This reduces the KVCO while ensuring that the circuit does not cease to oscillate.

FIG. 2 uses load transistors N12, N31-N34 to provide resistive load to the VCO stages. Multiple transistors can also be used to provide the same load. These transistors acting together comprise a load cell.

Figure 3A:
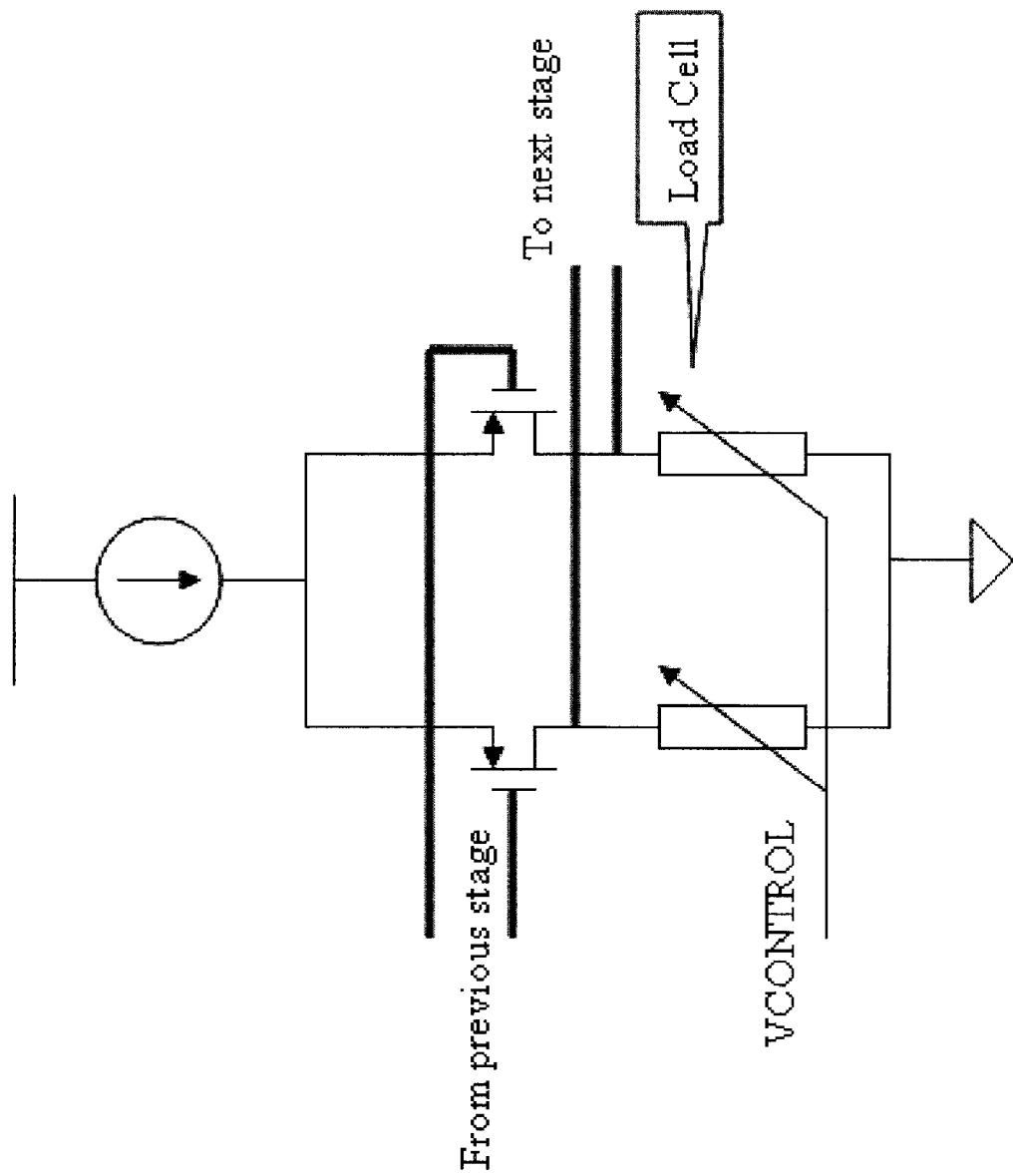
FIGS. 3A and 3B show exemplary schematics of a load cell in oscillating stage of VCO.
Figure 3B:
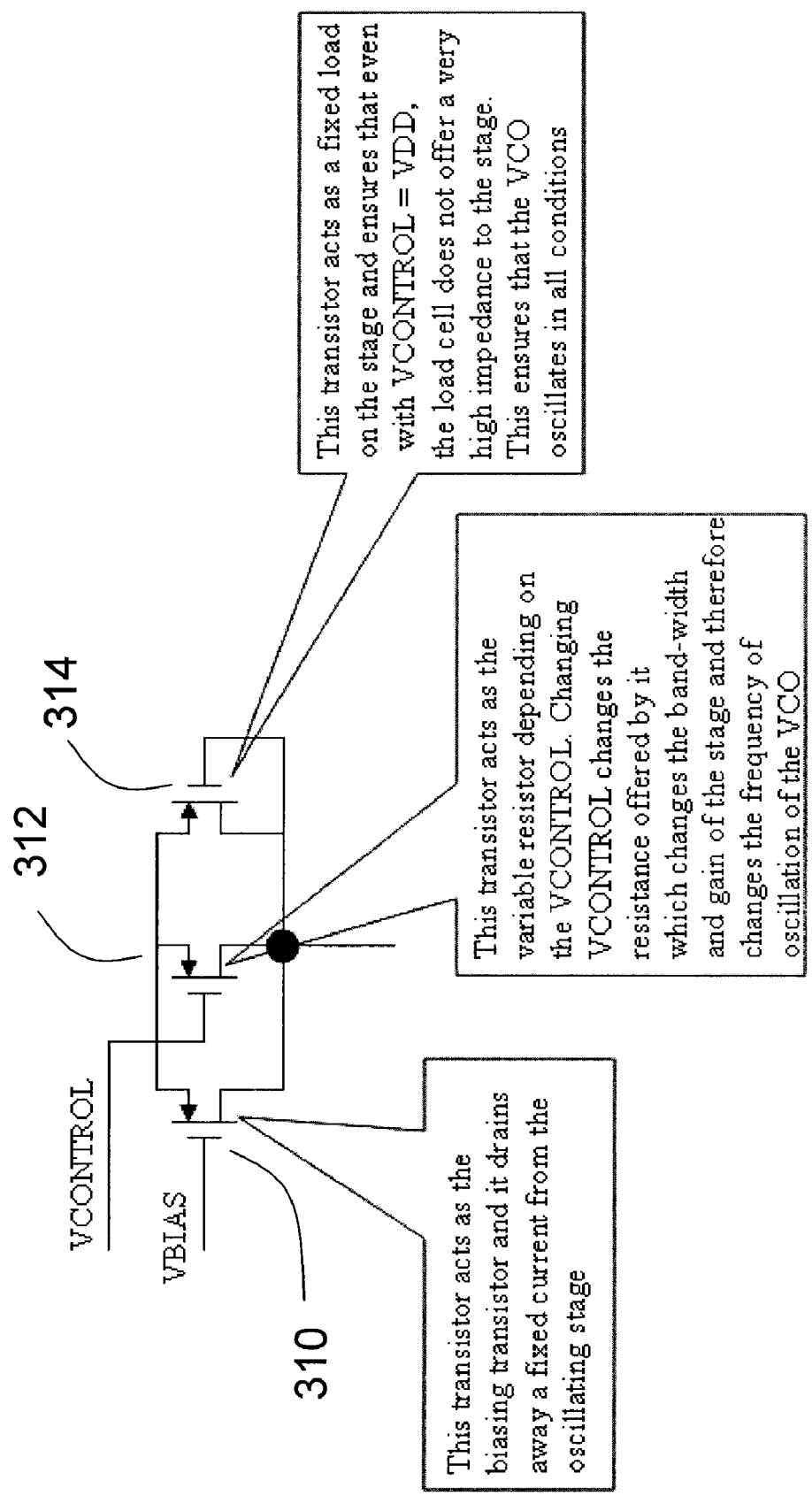

FIGS. 3A and 3B illustrate exemplary schematics of a load cell used in the oscillating stage of VCO. As shown in FIG. 3A, the load cell in the VCO offers variable impedance depending on the VCONTROL applied to it. For each stage of the VCO, the gain and bandwidth (BW) is closely related to the impedance offered by the load cell. For example, the Gain=$g\_m*R$, and BW=$1/(2*pi*R*C)$, wherein R is the resistance of the load cell.

The frequency of oscillation of a VCO is dependent on the bandwidth of the stage of the VCO, provided the gain of the loop is above a certain value. Once the resistance is reduced, the bandwidth increases and the gain of the stage decreases. The increase in the bandwidth increases the frequency of oscillation of the VCO as long as the loop gain is still above the critical value (which depends on the non-linearity imposed on each stage by the DC biasing and the number of oscillating stages).

As shown in FIG. 3B the load cell can comprise of a plurality of transistors in parallel, for example, a biasing transistor (310), a load transistor (312), and a fixed load transistor (314). The biasing transistor drains away a fixed current from the oscillating state. The load transistor acts as a variable resistor depending on the VCONTROL applied to it. The fixed load transistor ensures that the impedance of the load cell does not become too high if the VCONTROL becomes too high or too low. This is to ensure that the VCO oscillates in all conditions.

There are several disadvantages of the conventional load cell described with respect to FIG. 3B. For example, the transistor diode used as a default shunt load adds high capacitance on the output nodes. The higher capacitance requires more current to be dissipated for high frequency oscillation. Further, impedance supplied by the transistor diode is quite non-linear. This non-linearity distorts the waveform and adversely affects the jitter performance of the VCO. Also, the transistor diode causes higher jitter due to its own flicker and thermal noise.

Figure 4:
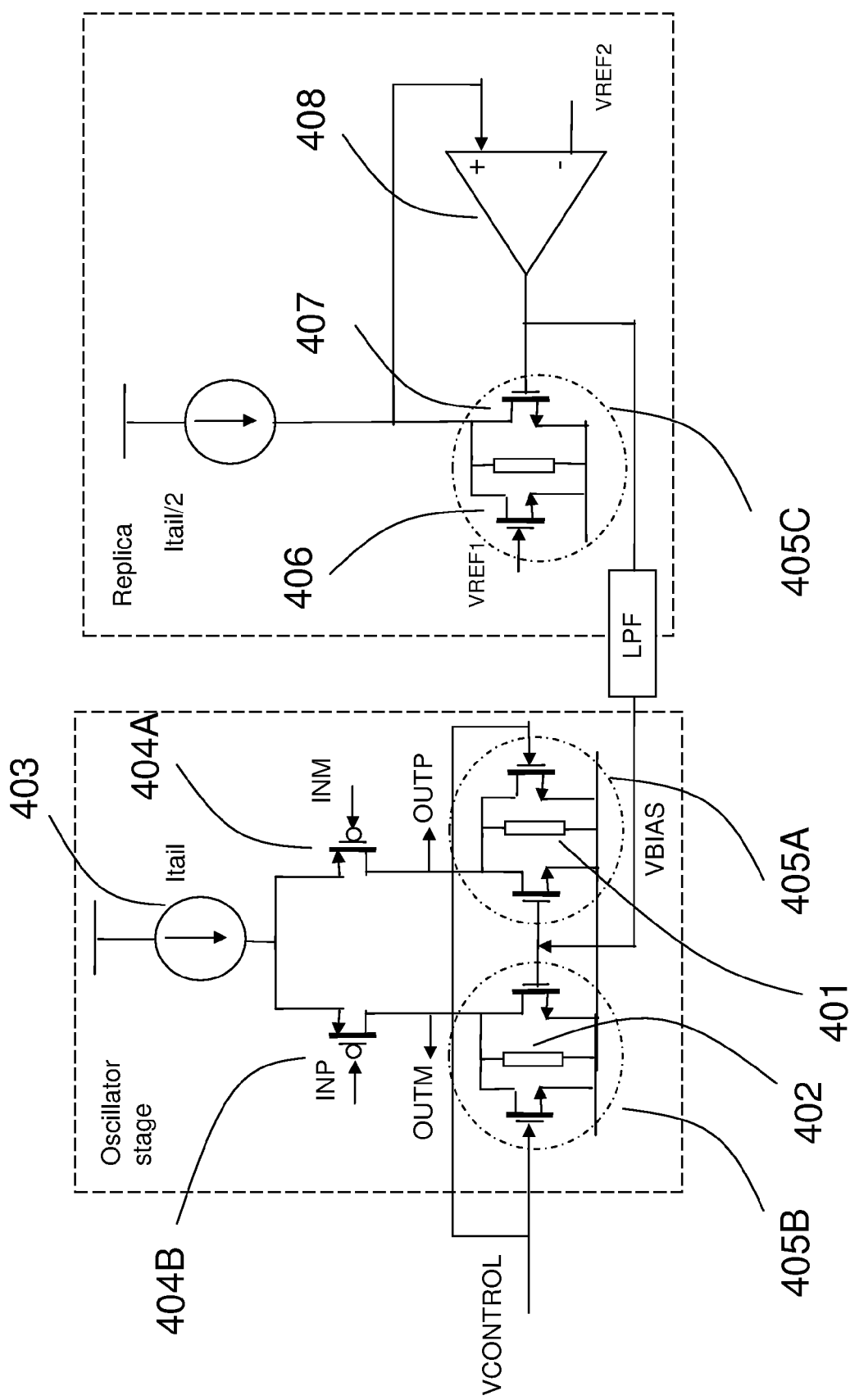
FIG. 4 shows a schematic of improved load cell in oscillating stage of VCO according to an embodiment of the present invention.

In an embodiment of the present invention, a resistor is used as the default shunt load. This advantageously overcomes or minimizes undesirable effects of the transistor diode as described above and throughout the present invention. An exemplary schematic of the load cell according to an embodiment of the present invention is illustrated in FIG. 4. Specifically, FIG. 4 shows NMOS implementation as an example, though PMOS or combination can also be used. It shows load resistors 401 and 402.

In an embodiment, the present invention also contemplates applying VCONTROL directly to the load cell, i.e., without requiring VCONTROL to pass through the bias stage as in conventional techniques (e.g., bias stage 102, 11 etc.). In certain other convention techniques, the bias stage can also perform functions such as converting voltage to bias current, converting bias voltage to another bias voltage etc. The conventional techniques suffer from several disadvantages as they require bias stage. For example, bandwidth of the PLL can be of the order of a few MHz. This implies that VCONTROL can have a signal bandwidth of a few tens of MHz. The bias stage needs to be faster than the expected rate of change of VCONTROL. This implies that the bias stage needs to have a very high bandwidth, which can also result in high power dissipation. Yet further, a high bandwidth bias stage can inject noise over a large frequency range. In order to prevent noise injection, the bias stage needs to exhibit low noise which can also increase the power dissipation.

As also shown in FIG. 4, the VCO comprises to a tail current source (403), two PMOS transistors (404A and 404B) connected in a differential configuration, and two load cells (405A and 405B). The load cells take as input a voltage signal VCONTROL which is the control voltage for changing the frequency of the VCO and a VBIAS which is the bias voltage for biasing the VCO appropriately.

According to this embodiment of the present invention, the VBIAS is generated as follows: A load cell 405C which is identical to (replica of) of any of the load cells 405A and 405B is provided. It is fed half the tail current of the oscillating stage. This ensures that when biased correctly, the current density in respective transistors of the load cells 405A, 405B and 405C is identical. In the replica load cell 405C, transistor 406 is biased at a predetermined reference voltage VREF1. This is to ensure that for the VCO to oscillate at the desired oscillating frequency, the VCONTROL is always close to this value VREF1. For example, VREF1 can be set to (V_MAX+V_MIN)/2, where V_MAX and V_MIN are the maximum and minimum desired values of VCONTROL respectively. The gate voltage of transistor 407 in the replica load cell is derived from an amplifier 408 in negative feedback. The amplifier's output is coupled to the gate of the transistor 407, its negative node is connected to another reference voltage VREF2, and the positive node is connected to the voltage across the load cell. The amplifier ensures that the gate of the transistor 407 is biased in such a way that with the current Itail/2, the load cell always generates the voltage VREF2 across it. The gate voltage of the transistor 407 is the VBIAS for the oscillating stage.

It is to be noted that if both the transistors 406 and 407 operate in the linear region of operation, by fixing the VREF2 and Itail, the resistance offered by the load cell is fixed over process, voltage and temperature.

It can further be noted that the oscillation frequency of the VCO depends on the capacitance at the output of the oscillating stage, and the resistance at the output of the oscillating stage. The capacitance is contributed to by the gate capacitance of various transistors. This is a well-controlled quantity in a typical CMOS process. By utilizing the above mentioned circuit, also it is also possible fix the resistance of the load cell and hence the operating frequency of the VCO over process, voltage and temperature. The VCO can be centered about any desired fixed frequency.

Moreover, by applying a control voltage VCONTROL different from VREF1, on the oscillating stages, it is possible to perturb the VCO system and change the frequency of oscillation. Since the VCO is already centered about the desired frequency of oscillation, a large tuning range is not required. Therefore, the transistor 407 can be of a small width. This small width allows a small frequency change to happen with a large change in the VCONTROL and this reduces the KVCO.

As also shown in FIG. 4, the bias voltage VBIAS is generated using a replica of a load cell. Moreover, as also shown therein, the VBIAS voltage is passed through a low pass filter so as to remove the noise from biasing circuitry. It is to be noted that VBIAS is a static DC voltage. On the other hand, VCONTROL needs to change at high frequency and according to present invention VCONTROL is directly applied to the load cell, i.e., by removing need to pass VCONTROL through bias circuitry. This can provide significant improvements in performance of VCO.

The circuits described herein can be implemented in CMOS, Bi-CMOS, Bipolar and other technologies. Moreover, the circuit can be implemented in various technologies such as large scale integrated circuits (LSI), very large scale integrated circuits (VLSI), circuits assembled using discrete components etc.

It should be appreciated that the specific embodiments described herein are exemplary only and should not unduly limit the scope of the invention. Persons of ordinary skill in the art can contemplate various alternatives and modifications. These alternatives and modifications lie within the scope and purview of the present invention

What is claimed is:

1. A Voltage Controlled Oscillator (VCO) including at least one load cell circuit, the load cell circuit comprising:
   a bias transistor adapted to drain a predetermined current from an oscillating stage, wherein the bias transistor places the VCO in a particular operating range based on a bias voltage;
   a control transistor adapted to vary resistance offered by it responsive to a control voltage applied, wherein the control transistor controls a frequency of oscillation of the VCO based on the control voltage;
   a resistor adapted to provide a clamp resistance, the bias transistor, the control transistor and the resistor are arranged in parallel, and
   the VCO further comprising a tail current source adapted to provide constant current to the oscillating stage.

2. The VCO of claim 1 wherein the resistor being a passive resistor.

3. The VCO of claim 1 wherein the control voltage is directly applied to the control transistor.

4. The VCO of claim 3 wherein the control voltage is not generated by a replica bias stage.

5. The VCO of claim 1 wherein a bias voltage is applied to the bias transistor.

6. The VCO of claim 5 wherein the bias voltage is generated by a bias stage.

7. The VCO of claim 6 wherein the bias voltage is passed from the bias stage to the load cell through a low pass filter.

8. The VCO of claim 6 wherein the bias stage comprises a replica load cell including a replica of the bias transistor, the load transistor and the resistor arranged in parallel.

9. The VCO of claim 8 wherein the bias voltage applied to the bias transistor of the load cell is derived from a bias transistor in the replica load cell.

10. The VCO of claim 9 wherein the bias voltage from the bias transistor in the replica load cell is supplied to the bias transistor of the load cell through a low pass filter.

11. The VCO of claim 8 wherein a gate voltage of the bias transistor in the replica load cell is derived from an output of an amplifier in positive feedback configuration, wherein a negative node of the amplifier is connected to a predetermined reference voltage, and a positive node is connected to a voltage across the replica load cell.

12. The VCO of claim 8 wherein a control voltage applied to a control transistor in the replica load cell is set to a predetermined value.

13. The VCO of claim 12 wherein the predetermined value is a constant value.

14. The VCO of claim 8, wherein the VCO further comprises a replica tail current source adapted to provide constant current to the replica load cell.

15. The VCO of claim 14, wherein the constant current of the replica tail current source is one half of a current level of the constant current of the tail current source.

16. A voltage controlled oscillator (VCO) comprising:
means for draining a predetermined current from an oscillating stage based on a bias voltage in order to place the VCO in a particular operating range;
means for varying resistance based on an applied control voltage, controlling a frequency of oscillation of the VCO based on the control voltage;
means for providing a clamp resistance; and
means for providing constant current to the oscillating stage; wherein the means for draining, the means for varying resistance, and the means for providing a clamp resistance are arranged in parallel.

17. The voltage controlled oscillator of claim 16, further comprising:
means for providing a replica of the means for draining, means for varying resistance, and the means for providing a clamp resistance.

18. The voltage controlled oscillator of claim 16, wherein the means for providing a replica includes a means for providing constant current to the means for providing a replica.

19. A method for operating a voltage controlled oscillator (VCO) comprising:
providing a first constant current to an oscillating stage of the voltage controlled oscillator; and
providing a variable control voltage to a load cell of the voltage controlled oscillator, wherein the load cell includes a bias transistor, a control transistor, and a resistor, arranged in parallel, wherein the variable control voltage controls a frequency of oscillation of the VCO through the control transistor.

20. The method of claim 19, further comprising:
providing a second constant current to a replica load cell of the voltage controlled oscillator, wherein the second constant current is one half of the first constant current.

* * * * *